United States Patent
Kohyama

(10) Patent No.: US 11,114,995 B2
(45) Date of Patent: Sep. 7, 2021

(54) PIEZOELECTRIC COMPONENT

(71) Applicant: KYOCERA Corporation, Kyoto (JP)

(72) Inventor: Jiro Kohyama, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 621 days.

(21) Appl. No.: 16/067,960

(22) PCT Filed: Nov. 28, 2016

(86) PCT No.: PCT/JP2016/085160
§ 371 (c)(1),
(2) Date: Jul. 3, 2018

(87) PCT Pub. No.: WO2017/126228
PCT Pub. Date: Jul. 27, 2017

(65) Prior Publication Data
US 2020/0274516 A1    Aug. 27, 2020

(30) Foreign Application Priority Data

Jan. 23, 2016    (JP) .............................. JP2016-011157

(51) Int. Cl.
*H03H 9/02*      (2006.01)
*H03H 9/10*      (2006.01)
*H03H 9/13*      (2006.01)
*H03H 9/17*      (2006.01)

(52) U.S. Cl.
CPC ...... *H03H 9/02125* (2013.01); *H03H 9/1014* (2013.01); *H03H 9/132* (2013.01); *H03H 9/176* (2013.01)

(58) Field of Classification Search
CPC .... H03H 9/02125; H03H 9/114; H03H 9/132; H03H 9/176
See application file for complete search history.

(56) References Cited

U.S. PATENT DOCUMENTS

| 6,369,487 B1 * | 4/2002 | Kameda | H03H 9/0557 310/320 |
| 6,369,489 B1 * | 4/2002 | Sawai | H03H 9/09 310/321 |
| 6,747,392 B1 * | 6/2004 | Wajima | H03H 9/177 310/320 |

FOREIGN PATENT DOCUMENTS

| CN | 1270447 A | 10/2000 |
| CN | 1290066 A | 4/2001 |
| JP | 63-161709 A | 7/1988 |
| JP | 2000-091875 A | 3/2000 |
| JP | 2003-124774 A | 4/2003 |

* cited by examiner

*Primary Examiner* — Jeffrey M Shin
(74) *Attorney, Agent, or Firm* — Volpe Koenig

(57) ABSTRACT

A piezoelectric component of the present disclosure includes: a substrate having a rectangular plate shape having a longitudinal direction and a width direction; a pair of electrodes disposed on a first surface of the substrate so as to leave space therebetween which is located in a central region in the longitudinal direction of the substrate; and a piezoelectric element both ends of which are fixed to the pair of electrodes, respectively, the pair of electrodes each including a notch extending from a central region side and in the longitudinal direction of the substrate.

5 Claims, 7 Drawing Sheets

PIEZOELECTRIC COMPONENT

TECHNICAL FIELD

The present disclosure relates to a piezoelectric component suitably used, for example, as a resonator.

BACKGROUND ART

The piezoelectric component, when used as a resonator, generally includes a supporting substrate, a piezoelectric element, and a lid member. Generally, the supporting substrate is provided with input and output electrodes for electrically connecting an external circuit board and a piezoelectric element in vicinities of both ends in a longitudinal direction of the supporting substrate in such as way as to transverse in a short direction of the supporting substrate. (For example, see Patent Literature 1).

CITAITON LIST

Patent Literature

Patent Literature 1: Japanese Unexamined Patent Publication JP-A 2000-091875

SUMMARY OF INVENTION

The piezoelectric component of the present disclosure includes a substrate having a rectangular plate shape having a longitudinal direction and a width direction; a pair of electrodes disposed on a first surface of the substrate so as to leave space therebetween which is located in a central region in the longitudinal direction of the substrate; and a piezoelectric element both ends of which are fixed to the pair of electrodes, respectively, the pair of electrodes each including a notch extending from a central region side and in the longitudinal direction of the substrate.

DESCRIPTION OF EMBODIMENTS

Figure 1:
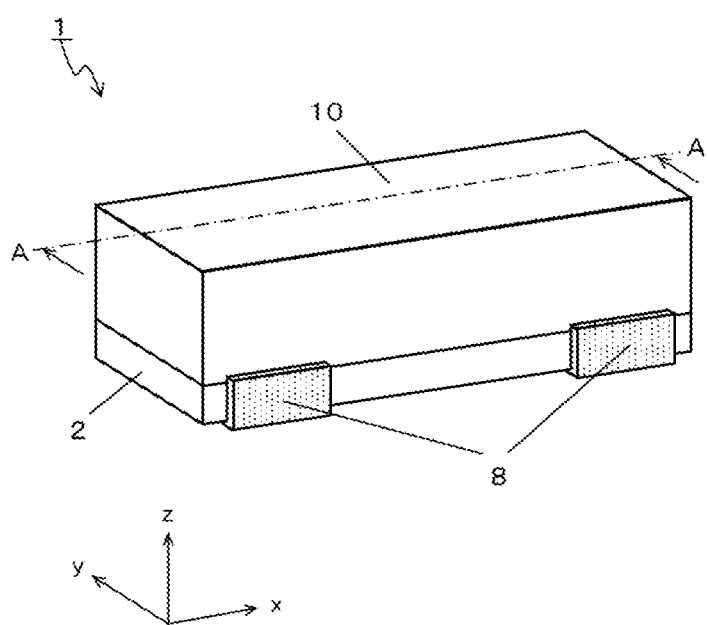
FIG. 1 is a perspective view showing an appearance of a piezoelectric component according to an embodiment.

Referring now to appended drawings, an example of an embodiment of a piezoelectric component in this disclosure will be described in detail. FIG. 1 and other figures include an orthogonal coordinate system xyz fixedly defined for a piezoelectric component 1. In the following description, directions may be explained with reference to this coordinate system. Any direction of the piezoelectric component 1 may be defined as a vertical direction or a horizontal direction and a z-axis direction may be referred to as a vertical direction, height direction or thickness direction. The simple term "plan view" for the piezoelectric component 1 is a view in the z-axis direction. It is to be understood that the embodiment described below is not intended to limit the invention.

Figure 2A:
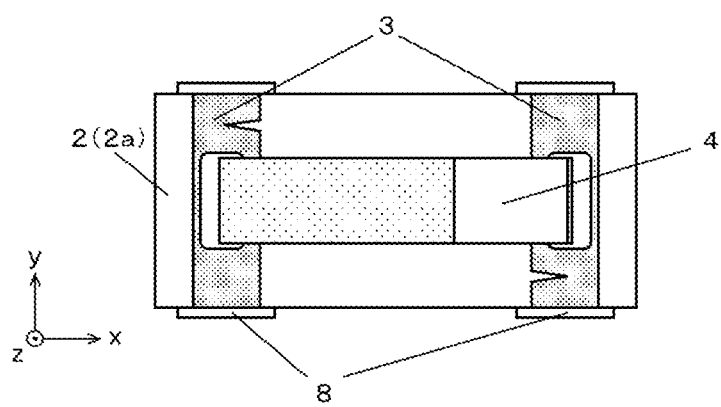
FIG. 2A is a partly omitted schematic plan view of the piezoelectric component illustrated in FIG. 1.
Figure 2B:
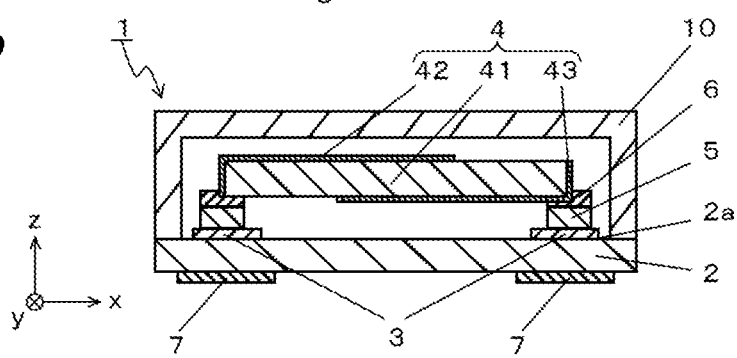
FIG. 2B is a cross-sectional view taken along a line A-A of the piezoelectric component illustrated in FIG. 1.
Figure 2C:
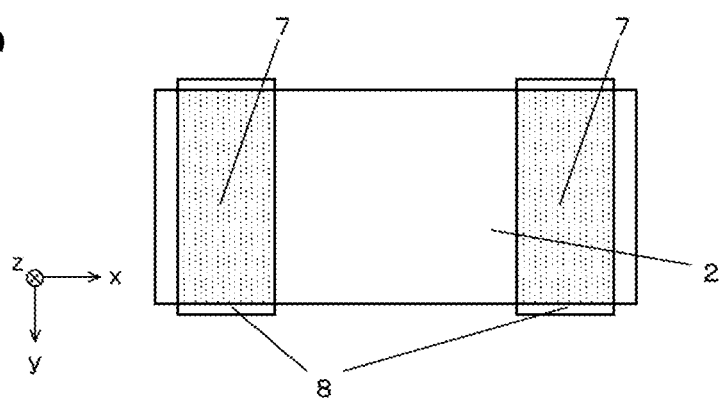
FIG. 2C is a bottom view of the piezoelectric component illustrated in FIG. 1.
Figure 3:
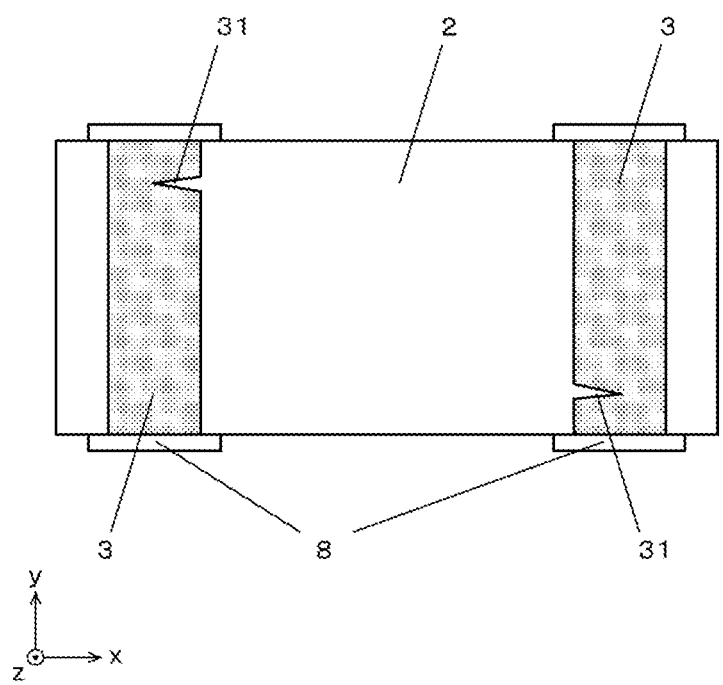
FIG. 3 is a schematic plan view showing electrodes of the piezoelectric component illustrated in FIGS. 2A to 2C.

The piezoelectric component 1 of an example illustrated in FIG. 1 to FIG. 3 includes a substrate 2 having a rectangular plate shape having a longitudinal direction and a width direction; a pair of electrodes 3 disposed on a first surface 2a of the substrate 2 so as to leave space therebetween which is located in a central region in the longitudinal direction of the substrate 2; and a piezoelectric element 4 both ends of which are fixed to the pair of electrodes 3, respectively. In the example illustrated in FIG. 1, a lid member 10 is disposed on the first surface 2a of the substrate 2 so as to cover the piezoelectric element 4.

The substrate 2 includes a dielectric body formed into a rectangular flat plate having a length of 2.5 mm to 7.5 mm, a width of 1.0 mm to 3.0 mm, and a thickness of 0.1 mm to 1 mm. The dielectric body may be formed of ceramic materials such as alumina and barium titanate, or resin materials such as glass epoxy.

The dielectric body which constitutes the substrate 2 is provided with the pair of electrodes 3 on the first surface 2a (upper surface in this example). The pair of electrodes 3 is electrodes for mechanically fixing both ends of the piezoelectric element 4 and for providing electrical connection with surface electrodes 42 (vibrating electrodes) of the piezoelectric element 4. The electrodes 3 are disposed so as to extend from one end to the other end of the substrate 2 in the width direction, and have a rectangular shape in plan view. The pair of electrodes 3 is disposed on the first surface 2a of the substrate 2 so as to leave space which is located in the central region in the longitudinal direction of the substrate 2. The distance is set by a length of the piezoelectric element 4, and the electrodes 3 are disposed respectively on both ends of the first surface 2a of the substrate 2 in the longitudinal direction. Accordingly, a size of the substrate 2 may be restricted from becoming too big for the size of the piezoelectric element 4, and the more downsized piezoelectric component 1 is obtained.

A pair of external electrodes 7 is disposed on a second surface 2b on the opposite side of the first surface 2a. The external electrodes 7 are electrodes for electrically and mechanically connecting the piezoelectric component 1 to an external circuit. The external electrodes 7 are disposed so as to extend from one end to the other end of the substrate 2 in the width direction, and have a rectangular shape in plan view. The pair of external electrodes 7 is electrically connected to the electrodes 3 via side electrodes 8 disposed on side surfaces of the substrate 2, respectively. This electrically connects the surface electrodes 42 (vibrating electrodes) of the piezoelectric element 4 and the external circuit to allow the input and output of signals. In other words, the pair of electrodes 3, the pair of side electrodes 8, and the pair of external electrodes 7 disposed on the substrate 2 constitute input and output electrodes. Note that, in the embodiment, the side electrodes 8 are disposed on both side surfaces of the substrate 2 in the width direction.

In the piezoelectric component 1 of the embodiment, the pair of electrodes 3 is provided with notches 31 extending from the central region side of the first surface 2a of the substrate and in a direction along the longitudinal direction of the substrate 2. In other words, depressions are formed on sides of the electrodes 3 on the central region side. Further, in other words, the notches 31 are provided on portions of the pair of electrodes 3 facing each other. This produces portions having a longer interval (distance) between the pair of electrodes 3, which are parts of the input and output electrodes. Therefore, a floating capacitance generated between the input and output electrodes are reduced, and restriction of variations in oscillation frequency in association with the floating capacitance is enabled, and consequently, the piezoelectric component 1 serving as a highly accurate resonator is obtained.

The notches 31 are provided in the electrodes 3 outside the central region of the substrate 2 in the width direction, that is, outside a portion where the piezoelectric element 4 is mounted, that is, on the side surface sides of the substrate 2. Accordingly, the floating capacitance may be reduced while securing joining areas between the electrodes 3 and the piezoelectric element 4.

Figure 4:
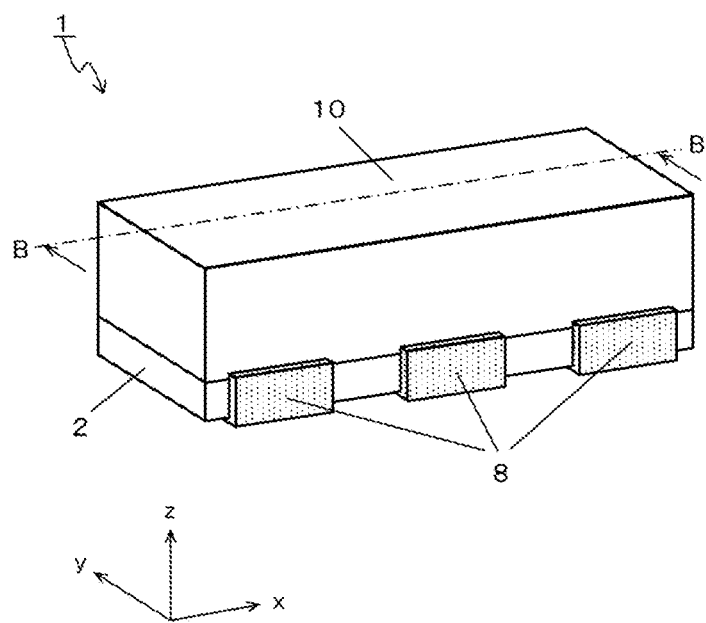
FIG. 4 is a perspective view showing an appearance of a piezoelectric component according to another example of the embodiment.
Figure 5A:
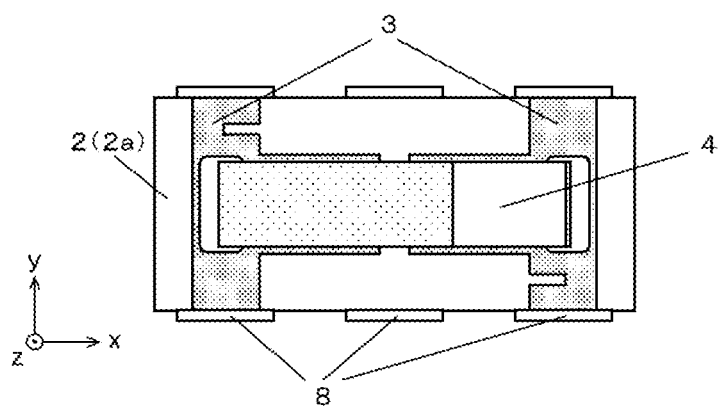
FIG. 5A is a partly omitted schematic plan view of the piezoelectric component illustrated in FIG. 4.
Figure 5B:
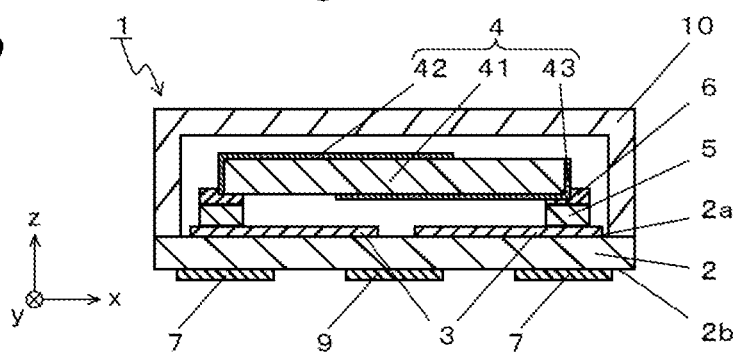
FIG. 5B is a cross-sectional view taken along a line B-B of the piezoelectric component illustrated in FIG. 4.
Figure 5C:
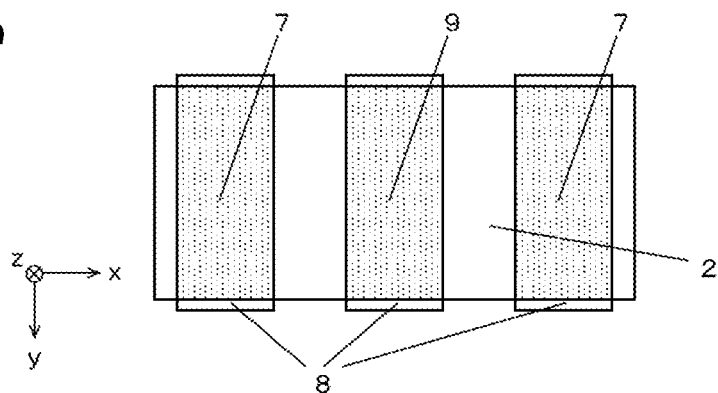
FIG. 5C is a bottom view of the piezoelectric component illustrated in FIG. 4.
Figure 6:
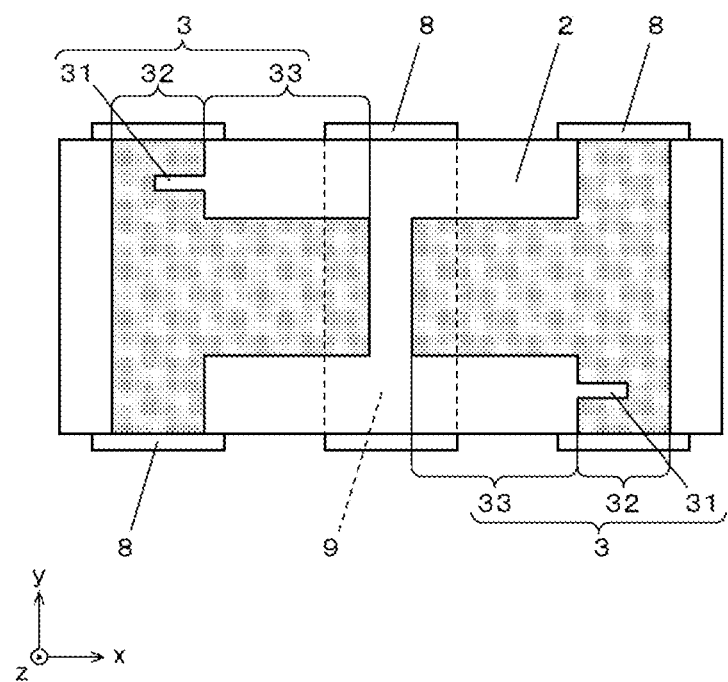
FIG. 6 is a schematic plan view showing electrodes of the piezoelectric component illustrated in FIGS. 5A to 5C.

In contrast to the example illustrated in FIG. 1 to FIG. 3, the substrate 2 in an example illustrated in FIG. 4 to FIG. 6 includes a ground electrode 9 in a central region of the second surface 2b opposite to the first surface 2a. The pair of electrodes 3 includes a first area 32 extending in the width direction of the substrate 2, and a second area 33 extending from the first area 32 toward the central region in the longitudinal direction, the second area 33 having a portion facing the ground electrode 9 with the substrate 2 (dielectric body) interposed therebetween. The notches 31 are provided so as to extend in the first areas 32 from the central region side and in the longitudinal direction, respectively.

The ground electrode 9 is disposed on the second surface 2b of the substrate 2 so as to extend from one end to the other end in the width direction of the substrate 2 in the central region in the longitudinal direction, and has a rectangular shape in plan view. The ground electrode 9 serves to form a capacitor with respect to the second areas 33 of the electrodes on the first surface 2a of the substrate 2, and is electrically connected to a ground potential such as an external circuit board.

Note that in the example illustrated in FIG. 4 to FIG. 6, the side electrodes 8, which are electrically connected to the ground electrode 9, are disposed on the lateral side surfaces of the substrate 2. The ground electrode 9 is not electrically connected to members such as electrodes on the first surface 2a of the substrate 2, and thus the ground electrode 9 is not always necessary. When the side electrodes 8 are also disposed on the lateral sides of the ground electrode 9, a joining material such as solder can be provided from the lower surface to side surfaces of the piezoelectric component 1 when the piezoelectric component 1 is mounted to the external circuit board, and therefore joining strength is improved, and it is possible to improve reliability in electrical and mechanical connection. Since it is for improvement of joining strength, electrical connection with the ground electrode 9 is not necessarily required.

The first areas 32 are portions equivalent to the electrodes 3 in the example illustrated in FIG. 1 to FIG. 3. In other words, the first areas 32 are areas mainly for mechanically fixing both ends of the piezoelectric element 4 and for providing electrical connection with the surface electrodes (vibrating electrodes) of the piezoelectric element 4. The first areas 32 are provided from one end (lateral side surface) to the other end (lateral side surface) in the width direction of the substrate 2, and have a rectangular shape in plan view. The first areas 32 are electrically connected to the pair of external electrodes 7 via the side electrodes 8 disposed on the side surfaces of the substrate 2, respectively. The first areas 32 of the pair of electrodes 3, the pair of side electrodes 8, and the pair of external electrodes 7 constitute input and output electrodes.

The second areas 33 are areas extending from the first areas 32 toward the central region of the substrate 2 and in the longitudinal direction. The second areas 33 are provided in the central region in the width direction of the substrate 2 from the first areas 32 to positions in the central region in the longitudinal direction of the substrate 2 where the second areas 33 overlap with the ground electrode 9 in transparent plan view, and have a rectangular shape in plan view. The shape of the entire electrode 3 including the first area 32 and the second area 33 is a T-shape.

The second areas 33 include portions opposed to the ground electrode 9 with the substrate 2 interposed therebetween. As in an example illustrated in FIG. 6, distal ends extending from the first areas 32 and in the longitudinal direction of the substrate 2 overlap with the ground electrode 9 in transparent plan view. A capacitor is formed by placing the dielectric body, that is, the substrate 2, between the ground electrode 9 and the second areas 33 of the electrodes 3. Accordingly, load capacity required for an oscillation circuit is integrated into the piezoelectric component 1. Using the piezoelectric component 1 as described above, the need for an additional member such as a chip capacitor to be mounted on the external circuit board or the like is eliminated, and thus it is possible to reduce the number of component and achieve downsizing of an oscillation circuit module using the piezoelectric component 1.

The magnitude of the load capacity may be set by the areas where the ground electrode 9 and the second areas 33 overlap with each other in transparent plan view. The magnitude of the load capacity may be set according to characteristics of an amplifying circuit element constituting an oscillation circuit together with the piezoelectric component 1 connected to the amplifying circuit element.

In this case, the first areas 32 of the pair of electrodes 3 is provided with the notches 31 extending from the central region side of the substrate 2 and in the longitudinal direction, respectively. In the same manner as described above, the floating capacitance is reduced, and restriction of variations in oscillation frequency in association with the floating capacitance is enabled, and thus the piezoelectric component 1 serving as a highly accurate resonator is obtained. In addition, the ground electrode 9 is disposed between the pair of external electrodes 7 which constitute part of the input and output electrodes, and thus, more effectively, the floating capacitance generated between the external electrodes 7 may be reduced.

The notches 31 are provided outside portions of the first areas 32 where the second areas 33 are connected and the piezoelectric element 4 is mounted, that is, outside the central region in the width direction of the substrate 2, that is, on the side surface sides of the substrate 2. The floating capacitance may be reduced while securing joining areas between the electrodes 3 and the piezoelectric element 4.

Figure 7:
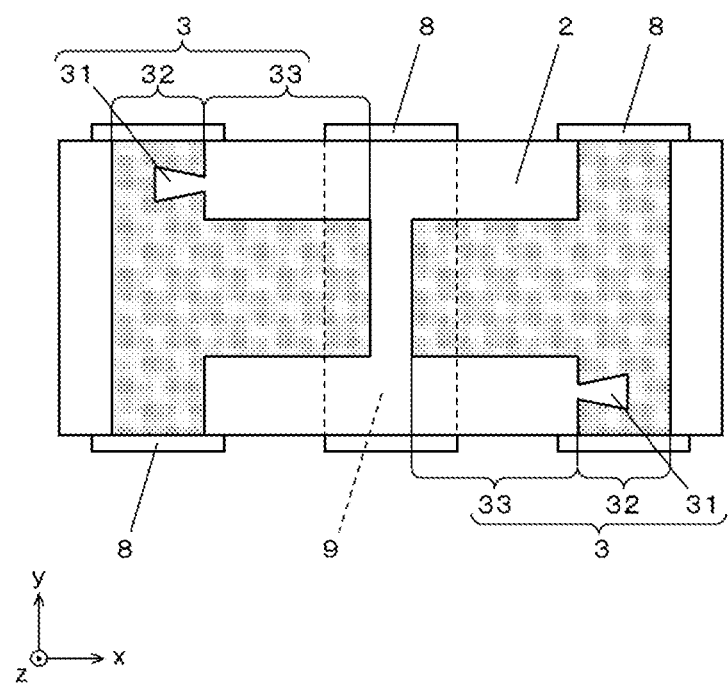
FIG. 7 is a schematic plan view showing electrodes of the piezoelectric component according to another example of the embodiment.

The shape of the notch 31 in plan view is a triangular shape in the example illustrated in FIGS. 2A to 2C and FIG. 3, and is a rectangular shape in the example illustrated in FIGS. 5A to 5C and FIG. 6. The rectangular shape is preferred for the notches 31 in order to increase the interval (distance) between the pair of electrodes 3 which is a part of the input and output electrodes, and reduce the floating capacitance. As in an example illustrated in FIG. 7, a trapezoidal shape having an upper base on the central region side of the substrate 2 and a lower base on the side farther from the central region, that is, a shape increasing in width as it goes away from the central region side may be employed. The floating capacitance generated between an inside portion of the notch 31 of one of the electrodes 3 (the portion extending in the longitudinal direction) and the other electrode 3 may be reduced. This is because the distance between the inside portion of the notch 31 of one of the electrodes 3 and the other electrode 3 corresponds to a distance in a direction inclined to the longitudinal direction (the x-axis direction of the drawing) of the substrate 2 and may be increased.

The size of the electrode 3 in the case of the example illustrated in FIG. 1 to FIG. 3 is, for example, such that the length along the width direction of the substrate 2 is 1.0 mm to 3.0 mm, which is the same as the width of the substrate 2, and the length along a direction of the length of the substrate 2 is 0.1 mm to 1.5 mm. In the case of the example illustrated in FIG. 4 to FIG. 6, the size of the first area 32 is, for example, such that the length along the width direction of the substrate 2 is 1.0 mm to 3.0 mm, which is the same as the width of the substrate 2, and the length along the direction of the length of the substrate 2 is 0.1 mm to 1.5 mm. The size of the second area is, for example, such that the length along the width direction of the substrate 2 is 0.3 mm to 1.2 mm, and the length along the direction of the length of the substrate 2 is 0.5 mm to 1.8 mm.

The width of the notch 31 (the length in the width direction of the substrate 2) may be, for example, 10% or more of the length of the electrode 3 in the direction along the width direction of the substrate 2. As described above, since the central regions of the electrodes 3 are regions where the piezoelectric element 4 is mounted, the notches 31 are formed on both outside portions of the central region, and these portions correspond to signal input and output channels. When the input and output channels become narrow, the resistance is increased, which may affect the oscillation circuit. Therefore, the notch 31 is preferably provided on one of both outsides of the central region. In order to do so, the width of the notches 31 (the length in the direction along the width direction of the substrate 2) may be set, for example, 10% to 30% of the length of the electrode 3 in the width direction of the substrate 2. The width of the notch 31 in the width direction of the substrate 2 corresponds to the width on the side portion of the electrodes 3 on the central region side of the substrate 2, in other words, an opening width. The length of the notch 31 (the length in the direction along the longitudinal direction of the substrate 2) may be, for example, 30% or more of the length of the electrode 3 in the direction along the longitudinal direction of the substrate 2.

The electrodes 3, the external electrodes 7, the side electrodes 8, and the ground electrode 9 contain, for example, metal such as gold, silver, copper, aluminum, and tungsten, as a major component. For example, when the substrate 2 is formed of a ceramic material, a so-called thick film conductor may be employed. As needed, the electrodes may be coated with Ni/Au or Ni/Sn plate on the surfaces thereof.

The piezoelectric element 4 serves to generate piezoelectric vibrations such as thickness-longitudinal vibrations or thickness-shear vibrations at a specific frequency in the piezoelectric component 1. The piezoelectric element 4 includes, for example, an elongated plate-shaped piezoelectric body 41, the surface electrodes 42 disposed on both main surfaces (one main surface and the other main surface) of the piezoelectric body 41, and end surface electrodes 43 disposed on an end surfaces of the piezoelectric body 41. The piezoelectric body 41 may be a flat plate-shape having, for example, a length of 1.0 mm to 4.0 mm, a width of 0.2 mm to 2 mm, and a thickness of 40 μm to 1 mm. The piezoelectric body 41 may be formed of a piezoelectric ceramics having a base material such as lead titanate, lead zirconate titanate, lithium tantalate, lithium niobate, sodium niobate, potassium niobate, or bismuth layer compound.

The surface electrodes 42 are vibrating electrodes for applying a voltage to the piezoelectric body 41 to vibrate the piezoelectric body 41. The surface electrodes 42 are disposed to have areas (intersecting areas) facing each other on one main surface and the other main surface of the piezoelectric body 41, respectively. One surface electrode 42 is disposed on the one main surface (upper surface) of the piezoelectric body 41 so as to extend from one end to the other end and in the longitudinal direction of the piezoelectric body 41, and the other surface electrode 42 is disposed on the other main surface (lower surface) of the piezoelectric body 41 so as to extend from the other end to one end in the longitudinal direction of the piezoelectric body 41, and the surface electrodes 42 have areas facing each other with the piezoelectric body 41 interposed therebetween. The surface electrodes 42 may be formed of a metal such as gold, silver, copper, aluminum, chrome, and nickel and have a thickness of 0.1 μm to 3 μm. The surface electrodes 42 are connected to end surface electrodes 43 at the ends of the piezoelectric body 41, respectively. The end surface electrodes are provided to improve mountability and joining strength when the piezoelectric element 4 is mounted on the substrate 2. The end surface electrodes 43 are formed of the same material and have the same thickness as the surface electrodes 42.

When a voltage is applied between the surface electrodes (vibrating electrodes), the piezoelectric element 4 as described above generates piezoelectric vibrations such as thickness-longitudinal vibrations or thickness-shear vibrations at a specific frequency in areas (intersecting areas) where the surface electrodes 42 (vibrating electrodes) face each other. The surface electrodes 42 and the end surface electrodes 43 of the piezoelectric element 4 and the electrodes 3 on the substrate 2 are electrically connected via a conductive joining material 6 to apply a voltage to the piezoelectric element 4. As in examples illustrated in FIG. 2B and FIG. 5B, supporting portions 5 are disposed on the electrodes 3 of the substrate 2. The piezoelectric element 4 is mounted on the supporting portions 5 so as to be vibratable. Specifically, the supporting portions 5 disposed on the pair of electrodes 3 support both ends of the piezoelectric element 4 in the longitudinal direction, respectively. This forms a space between the central region of the piezoelectric element 4 and the substrate 2, and the piezoelectric element 4 is mounted therein so as to be vibratable. The supporting portions 5 have, for example, conductivity, and are column-shaped member containing powder of metal such as gold, silver, copper, aluminum, or tungsten dispersed in a resin. For example, the supporting portions 5 have lengths (diameters) in vertical and lateral directions of 0.1 mm to 1.0 mm, a thickness of 10 µm to 100 µm, and have a square column shape or a cylindrical shape in plan view.

A conductive joining material 6 is disposed on the electrodes 3 and the supporting portions 5, and both ends of the piezoelectric element 4 in the longitudinal direction are mechanically connected to the electrodes 3 and the supporting portions 5 via the conductive joining material 6. The surface electrodes 42 (vibrating electrodes) and the end surface electrodes 43 of the piezoelectric element 4 are electrically connected to the electrodes 3 via the supporting portions 5 and the conductive joining material 6. As the conductive joining material 6, for example, solder or a conductive adhesive agent is used, and in the case of solder, lead-free materials such as copper, tin or silver may be used, and in the case of a conductive adhesive agent, an epoxy-based conductive resin or silicone-based resin containing 75 to 95% by mass of conductive particles such as silver, copper or nickel may be used.

As in the examples illustrated in FIG. 2B and FIG. 5B, a lid member 10 may be disposed on the substrate 2 so as to cover the piezoelectric element 4. The lid member 10 is joined to a peripheral portion of the upper surface of the substrate 2 with an adhesive agent, and thus has a function of protecting the piezoelectric element 4 stored in an internal space defined with the substrate 2 from external physical influences and chemical influences, and an air-tight sealing function for preventing entry of foreign substances such as water into the space defined with the substrate 2. Examples of the material of the lid member include metals such as stainless steel, ceramics such as alumina, resins, and glass. An insulating resin material such as an epoxy resin containing inorganic filler at a proportion of 25 to 80% by mass is also applicable to reduce a difference in coefficient of thermal expansion with respect to the substrate 2.

Figure 8:
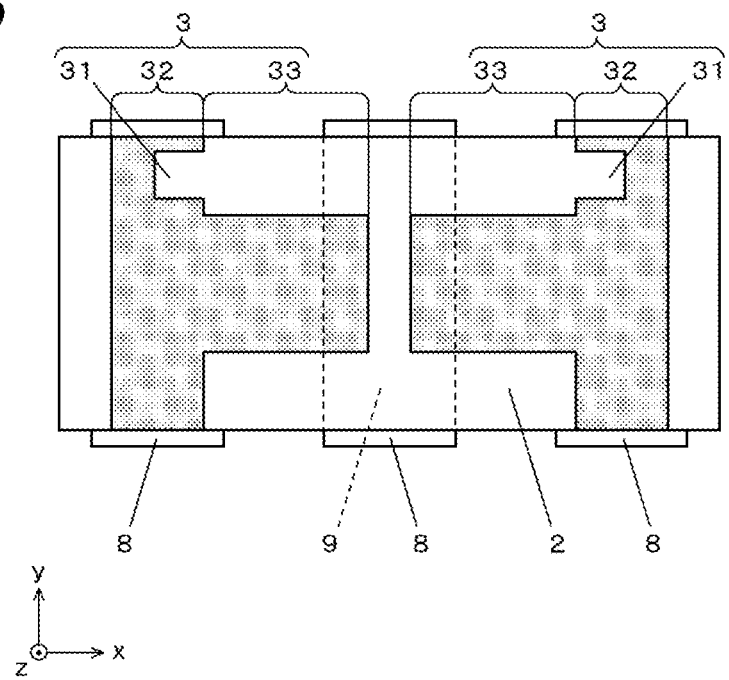
FIG. 8 is a schematic plan view showing electrodes of the piezoelectric component according to another example of the embodiment.

The notches 31 provided in the pair of electrodes 3 may be located at positions opposed to each other with the central region of the substrate 2 interposed therebetween as in an example illustrated in FIG. 8. In this configuration, the floating capacitance generated between the input and output electrodes is further reduced, and variations in oscillation frequency in association with the floating capacitance can be further restricted, so that a highly accurate resonator can be provided. When the notch 31 of one electrode 3 is translated in the longitudinal direction of the substrate 2, it is sufficient that there is a portion where opening portions of the notches 31 of both electrodes 3 overlap with each other, and more preferably, two opening portions are aligned.

Figure 9:
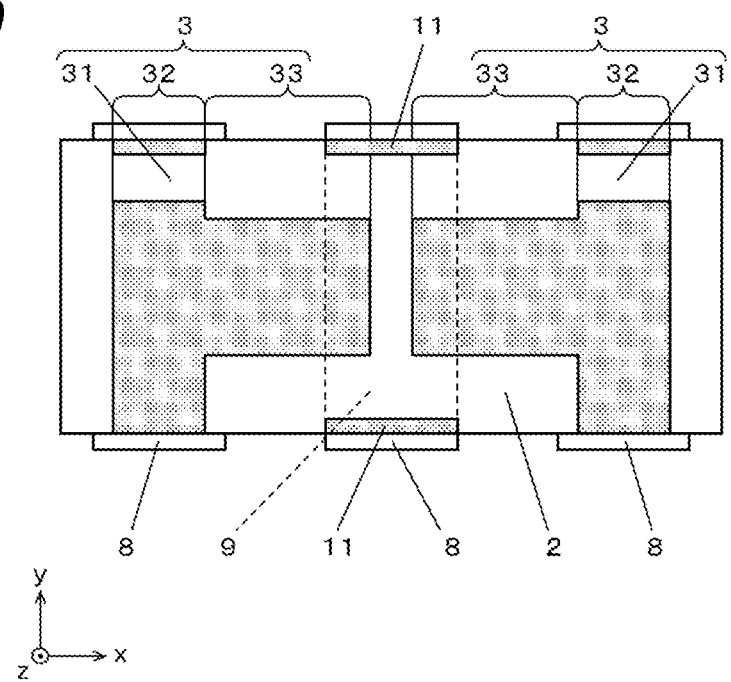
FIG. 9 is a schematic plan view showing electrodes of the piezoelectric component according to another example of the embodiment.

The notches 31 may divide the electrodes 3 in the width direction of the substrate 2 as in an example illustrated in FIG. 9. In other words, the length of the notch 31 may be the same as the length of the electrode 3 (first areas 32) along the longitudinal direction of the substrate 2. In this configuration, the pair of electrodes 3 does not face each other with the central region of the substrate 2 interposed therebetween in a part where the notches 31 are provided, and thus the floating capacitance generated in this part may be eliminated, so that the floating capacitance generated between the input and output electrodes is further reduced. Since the notches 31 in this configuration are provided only on one side of the electrodes 3 with respect to the central regions as described above, sides of the electrodes having no notch 31 are connected to the side electrodes 8, and thus the function as the input and output electrodes is not impaired.

Figure 10:
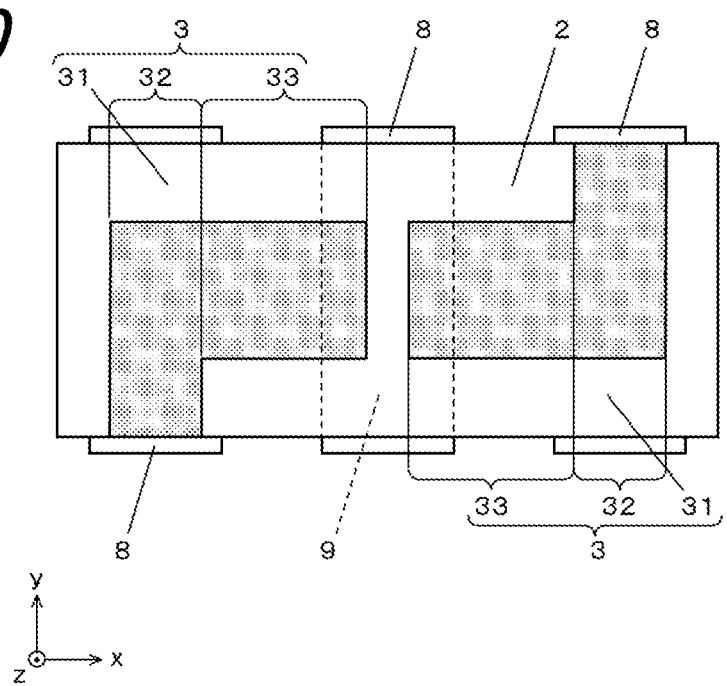
FIG. 10 is a schematic plan view showing electrodes of the piezoelectric component according to another example of the embodiment.

The width of the notch 31 in this configuration may be defined as a distance from the central region of each electrode 3 to the end of the substrate 2 in the width direction, as in an example illustrated in FIG. 10. The example illustrated in FIG. 10 is the case where the electrodes 3 include the first areas 32 and the second areas 33, and thus the shape of the electrodes 3 in plan view is an L-shape. In contrast, in the example illustrated in FIG. 9, the notches 31 are not formed up to the end of the substrate 2 in the width direction, and parts of the electrodes 3 connected to the side electrodes 8 are left. In this configuration, especially when the electrodes 3 and the side electrodes 8 are formed by a thick-film conductor, for example, the joining strength between the side electrodes 8 and the substrate 2 can be improved. In the example illustrated in FIG. 9, the same parts as these parts are provided as reinforcement conductors 11 which are connected to the side electrodes 8 connected to the ground electrode 9.

In the example illustrated in FIG. 10, the width of the notch 31 is defined as a distance from the central region of the electrodes 3 to the end of the substrate 2 in the width direction, and the notches 31 provided on the pair of electrodes 3, respectively, are located so as not to face each other with the central region of the substrate 2 interposed therebetween. The two L-shaped electrodes 3 are arranged in point symmetry with respect to a center of the first surface 2a of the substrate 2. In this configuration, first areas 3a of the respective electrodes 3 do not face each other at any portion, so that the floating capacitance generated between the input and output electrodes is further reduced.

As in the shapes illustrated in FIG. 9 and FIG. 10, the notches in this application also include such a shape that a part of the electrode 3 (first area 32) is divided or such a shape that a notch is not provided up to the end of the substrate 2 in the width direction.

REFERENCE SIGNS LIST

1: Piezoelectric component
2: Substrate
2a: First surface
2b: Second surface
3: Electrode
31: Notch
32: First area
33: Second area
4: Piezoelectric element
41: Piezoelectric body
42: Surface electrode
43: End surface electrode
5: Supporting portion
6: Conductive joining material
7: External electrode
8: Side electrode
9: Ground electrode
10: Lid member
11: Reinforcement conductor

The invention claimed is:

1. A piezoelectric component, comprising:
a substrate having a rectangular plate shape having a longitudinal direction and a width direction;
a pair of electrodes disposed on a first surface of the substrate so as to leave space therebetween which is located in a central region in the longitudinal direction of the substrate; and a piezoelectric element both ends of which are fixed to the pair of electrodes, respectively, the pair of electrodes each including a notch extending from a central region side and in the longitudinal direction of the substrate, wherein the substrate includes a ground electrode at a central region of a second surface opposite to the first surface, the pair of electrodes each includes a first area and a second area, the first area is longer in the width direction of the substrate than the second area, the second area extends from the first area toward the central region and in the longitudinal direction, and has a portion facing the ground electrode with the substrate interposed therebetween, and the notch extends in the first area.

2. The piezoelectric component according to claim 1, wherein the notches provided in the pair of electrodes are located at positions opposed to each other with the central region interposed therebetween.

3. The piezoelectric component according to claim 1, wherein the notches divide the pair of electrodes in the width direction thereof, respectively.

4. A piezoelectric component, comprising:

a substrate having a rectangular plate shape having a longitudinal direction and a width direction;

a pair of electrodes disposed on a first surface of the substrate so as to leave space therebetween which is located in a central region in the longitudinal direction of the substrate; and a piezoelectric element both ends of which are fixed to the pair of electrodes, respectively, the pair of electrodes each including a notch extending from a central region side and in the longitudinal direction of the substrate, wherein the notches divide the pair of electrodes in the width direction thereof, respectively.

5. The piezoelectric component according to claim 4, wherein the notches provided in the pair of electrodes are located at positions opposed to each other with the central region interposed therebetween.

* * * * *